United States Patent [19]
Durham et al.

[11] Patent Number: 5,550,490
[45] Date of Patent: Aug. 27, 1996

[54] SINGLE-RAIL SELF-RESETTING LOGIC CIRCUITRY

[75] Inventors: Christopher M. Durham; Visweswara R. Kodali; Salim A. Shah, all of Austin, Tex.

[73] Assignee: International Business Machines Corporation, Armonk, N.Y.

[21] Appl. No.: 450,056

[22] Filed: May 25, 1995

[51] Int. Cl.$^6$ .................... H03K 19/096; H03K 19/00
[52] U.S. Cl. ................. 326/98; 326/93; 327/142; 327/206
[58] Field of Search ................. 326/51, 95, 98, 326/93, 94; 327/227, 205, 206, 142, 143, 198

[56] References Cited

U.S. PATENT DOCUMENTS

| | | | |
|---|---|---|---|
| 3,859,513 | 1/1975 | Chuang et al. | 235/153 |
| 4,451,745 | 5/1984 | Itoh et al. | 326/83 |
| 4,488,066 | 12/1984 | Shoji | 326/98 |
| 4,506,168 | 3/1985 | Uya | 327/206 |
| 4,563,598 | 1/1986 | Oritani | 326/98 |
| 4,687,955 | 8/1987 | Koinuma | 327/206 |
| 4,748,348 | 5/1988 | Thong | 326/93 |
| 4,893,033 | 1/1990 | Itano et al. | 326/40 |
| 4,904,884 | 2/1990 | O'Shaughnessy et al. | 327/206 |
| 5,010,259 | 4/1991 | Inoue et al. | 326/98 |
| 5,134,316 | 7/1992 | Ta | 326/98 |
| 5,334,883 | 8/1994 | Rosenthal | 327/206 |

OTHER PUBLICATIONS

"Analysis and Design Of Digital Integrated Circuits", Hodges et al, McGraw–Hill, 1983, p. 326.

*Primary Examiner*—Edward P. Westin
*Assistant Examiner*—Richard Roseen
*Attorney, Agent, or Firm*—Kelly K. Kordzik; Winstead Sechrest & Minick P.C.; Mark E. McBurney

[57] ABSTRACT

A forward single-rail self-resetting reset circuit is utilized to reset a logic circuit to a selected state subsequent to each iteration of a logical operation on inputted data into the logic circuit. The reset circuit receives at least one of the data inputs and its complement signal so that the reset signal produced by the reset circuit is activated regardless of the voltage level of the data input signals.

19 Claims, 7 Drawing Sheets

SINGLE-RAIL SELF-RESETTING LOGIC CIRCUITRY

FIELD OF THE INVENTION

The present invention relates in general to logic circuits, and in particular, to self-resetting logic circuitry.

BACKGROUND OF THE INVENTION

A logic circuit is a circuit designed to perform a particular logical function based on the concepts of "and", "either-or", "neither-nor", etc. Normally, these circuits operate between two discreet voltage levels, i.e. high and low logic levels, and are described as binary logic circuits.

Binary logic circuits are the basic building blocks of data processing systems and almost any electronic computing device. Binary logic circuits are extensively used in computers to carry out instructions and arithmetical processes. Any logical procedure may be effected by using a suitable combination of these basic gates.

Because of their low power dissipation, complementary CMOS (metal-insulator-semiconductor) field-effect transistors (FETs) are often used to construct such logic circuits.

Figure 1:
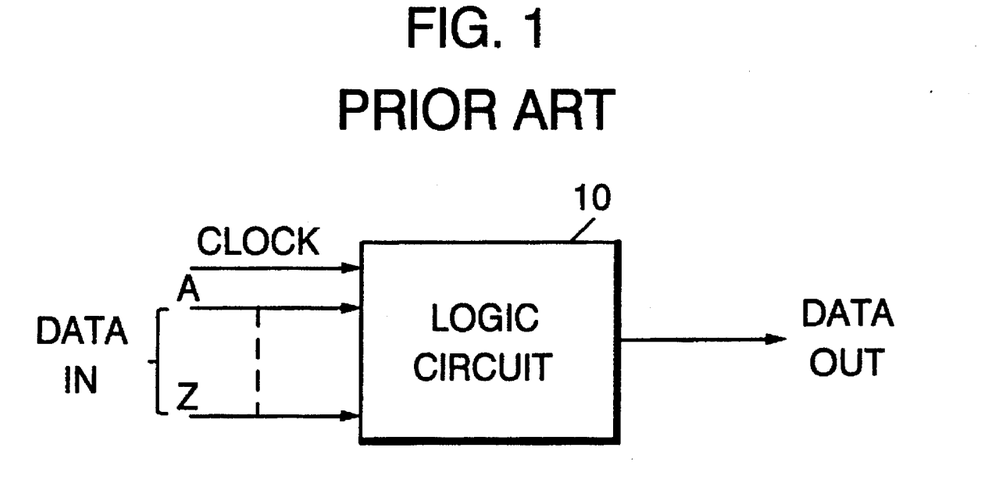
FIG. 1 illustrates a prior art logic circuit utilizing a system clock.

Because logic circuits are often cascaded in a plurality of connected stages, clock pulses are applied to the elements of a logic circuit to effect logical operations, i.e., drive the logical circuit. Referring to FIG. 1, there is illustrated typical logic circuit 10, which may implement any logical function, having Data In inputs A—Z and a Data Out output. A clock signal is inputted to logic circuit 10 in order to drive the Data In inputs through logic circuit 10 in order to effect the associated logical function implemented in logic circuit 10 upon the data inputs in order to arrive at the solution, which is outputted as Data Out.

The periodic clock signal also serves to prepare, or precharge, logic circuit 10 so that it is ready for the next series of Data In inputs subsequent to outputting the previous Data Out.

One problem with utilizing a clock signal to synchronize all logical operations within very large scale integrated (VLSI) circuitry is that the overall system clock signal may be subjected to noise and clock skew while being transmitted throughout the VLSI circuitry, resulting in a distorted and inaccurate clock signal incorrectly driving any particular logic circuit 10, which may ultimately result in inaccurate operation of the VLSI circuitry, which could be a portion of a central processing unit ("CPU"). Also, the clock speed is determined by the slowest path in the CPU. Another problem is that traditional clocking for precharged circuits also requires the intersection of a "precharge phase" or "time" into the system. This time may decrease the overall system performance by requiring foot devices (also known as evaluate or interrupt devices) causing an increase in power and delay.

Figure 2:
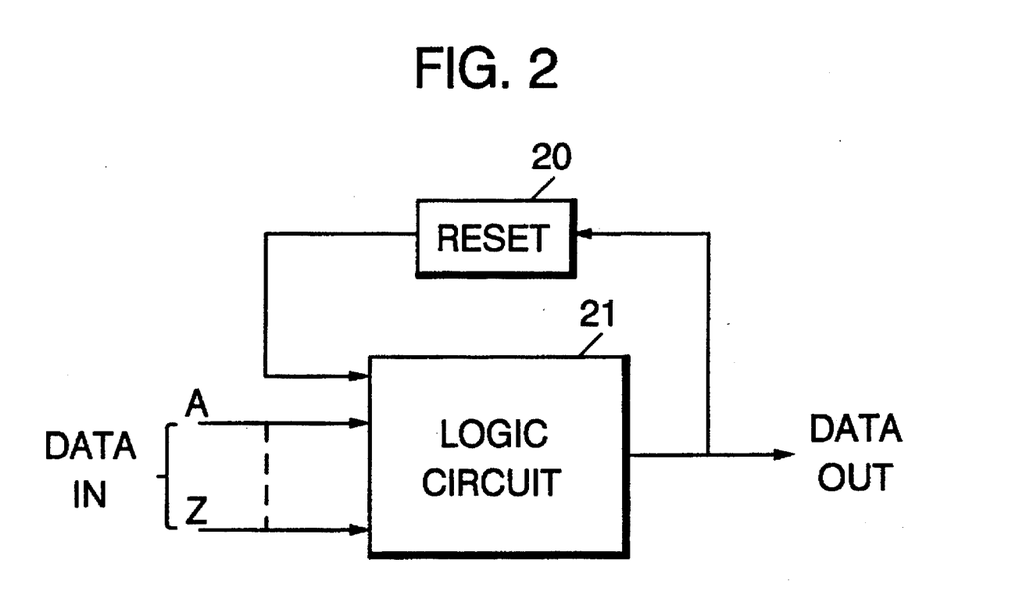
FIG. 2 illustrates a self-resetting logic circuit.

Referring to FIG. 2, a solution to the foregoing problem is the use of reset circuit 20 in order to precharge logic circuit 21 to a ready state so that it can accept the Data In and perform the logical operation correctly. In such a design, a clock signal is not needed.

Figure 3:
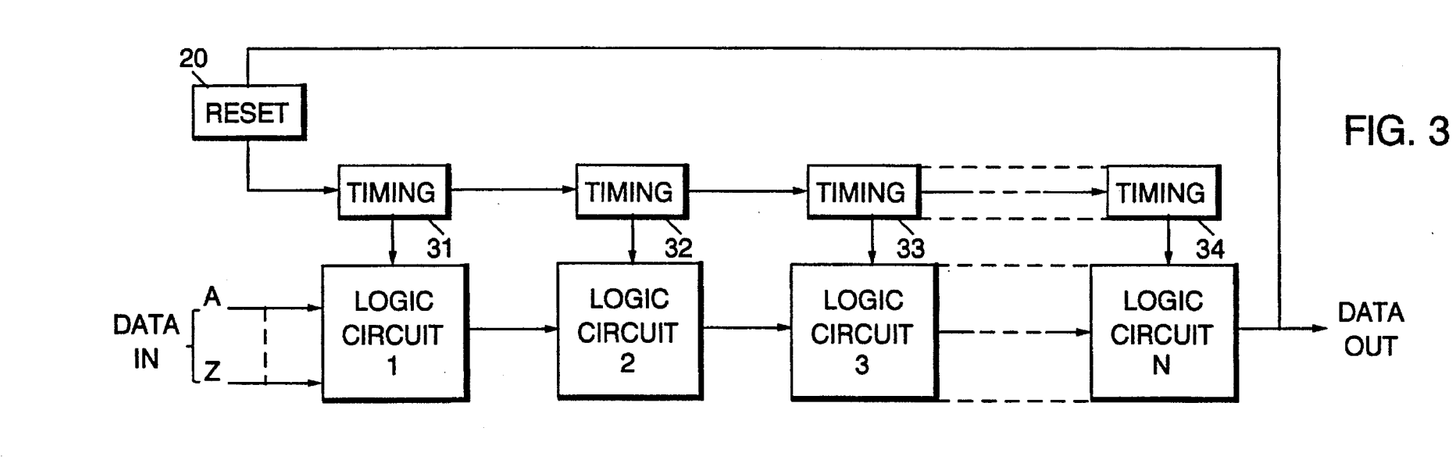
FIG. 3 illustrates multistage logic circuitry utilizing a self-resetting functionality.

Referring next to FIG. 3, there is illustrated a cascade of logic circuits 1, 2, 3, ... N. The output Data Out is sent to reset circuit 20, which operates to reset each of logic circuits 1-N. Timing circuits 31, 32, 33 and 34 operate to properly time the resetting of the logic circuits 1-N so that the reset occurs at the proper time, e.g., after each logic circuit has performed its operation and outputted its result. Timing circuits 31–34 may comprise conventional buffer circuits.

Figure 4:
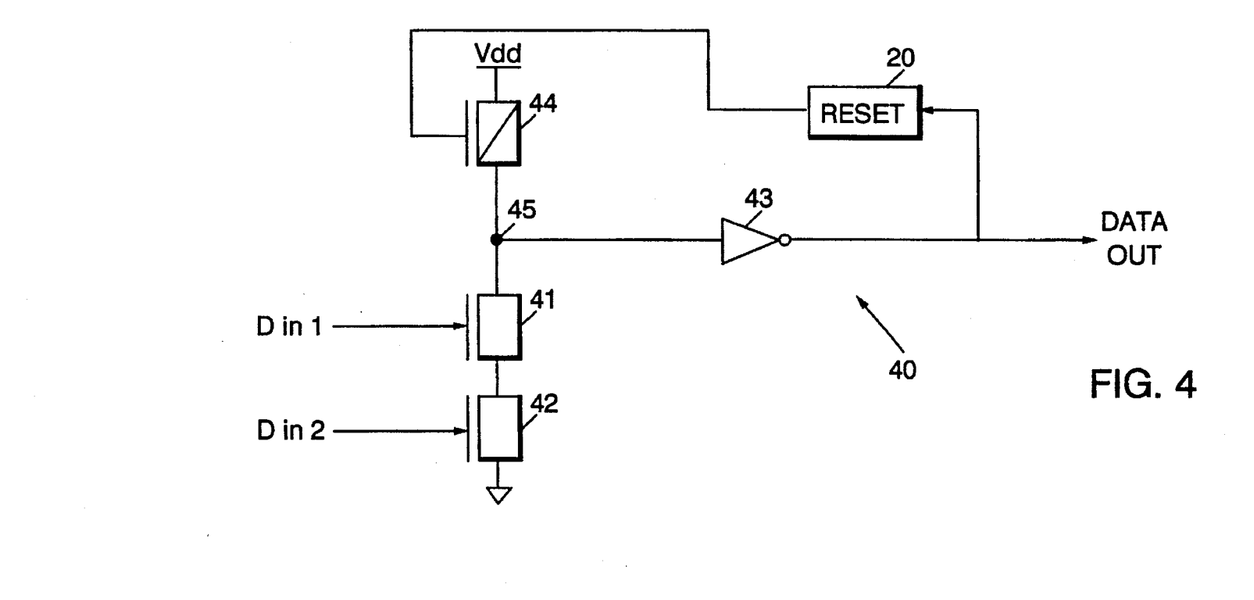
FIG. 4 illustrates an AND logic circuit that is self-resetting.

A more detailed diagram of a self-resetting logical circuit is illustrated in FIG. 4, wherein there is illustrated typical logic circuit 40, which is operable to perform a logical AND operation on the input data Din1 and Din2. The circuit, being made in the CMOS technology, has its P-channel FETs indicated by a rectangle with a diagonal line formed therein and a gate electrode arranged adjacent thereto and its N-channel FETs indicated by a rectangle without a diagonal line and a gate electrode arranged adjacent thereto. This convention will be followed through the various FIGURES. N-FETs 41 and 42 receive the inputted data. If either Din1 or Din2 is at a logical low level, then node 45 is at a logical high level resulting in a logical low level outputted as Data Out because of the transmission of the high level at node 45 through inverter circuit 43. If both of the inputs Din1 and Din2 are at a logical high level, then N-FETs 41 and 42 will be turned on resulting in a logical low level at node 45 resulting in a logical high level being outputted at Data Out.

Logical circuit 40 also includes P-FET device 44 coupled between node 45 and voltage supply VDD. Reset circuit 20 is coupled between the output terminal and the gate electrode of device 44. As will be described below, reset circuit 20 may act to apply a low level signal to the gate electrode of 44 upon receiving the high level output from the output of inverter circuit 43. Thus, upon output of a high level signal from circuit 40, reset circuit 20 will result in a precharging of node 45 to a high level through the switching on of P-FET device 44. Circuit 40 is then ready to receive another set of input values for a subsequent logical operation.

Figure 5:
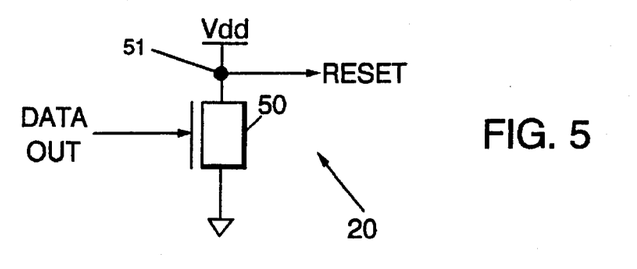
FIG. 5 illustrates one embodiment of a reset circuit.

Referring next to FIG. 5, there is illustrated one possible embodiment of reset circuit 20 wherein Data Out is received at the gate electrode of N-FET device 50, which turns on to pull node 51 to a ground, or low voltage, potential, which is sent as the Reset signal to device 44 in FIG. 4.

Figure 6:
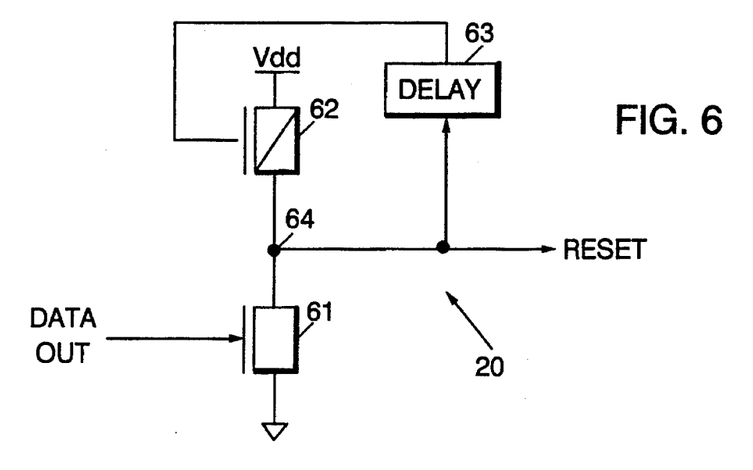
FIG. 6 illustrates another embodiment of a reset circuit.

Referring next to FIG. 6, there is illustrated another embodiment of reset circuit 20 whereby the Data Out signal is received at the gate electrode of N-FET device 61, which pulls node 64 to a ground potential, which is outputted as the Reset signal. The Reset signal is also supplied to delay circuit 63, which may comprise one or more buffer circuits, which supplies the delayed Reset signal to the gate electrode of P-FET device 62, which operates to pull node 64 back to a high potential for the next Data Out signal to be received by reset circuit 20.

It is clear that circuit 40 may not be properly reset by reset circuit 20 if the logical level of Data Out is low, since reset signal 20 may convert this outputted logical low level to a high level, which will not turn on P-FET 44. Thus, unless the ground potential is applied to node 45 by the input data applied to the gate electrodes of N-FET devices 41 and 42, circuit 40 may not be properly reset, or precharged, for a subsequent logical operation.

Figure 8:
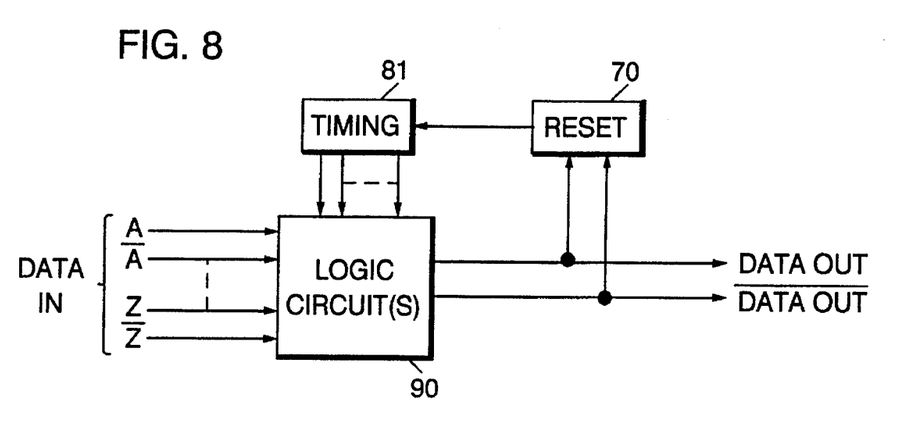
FIG. 8 illustrates a self-resetting dual-rail logic circuit.

Referring to FIG. 8, there is illustrated a block diagram of a solution to the foregoing problem whereby logic circuit(s) 90 (described in more detail below with respect to FIG. 9) receives a complementary value (inverse) for each data input and outputs a complimentary Data Out (i.e., inverse of Data Out) along with the true Data Out. This is known as a logic circuit having dual-rail inputs and outputs. Both of these outputs are then applied to reset circuit 70, which resets logic circuit(s) 80 through timing circuitry 81.

Figure 7:
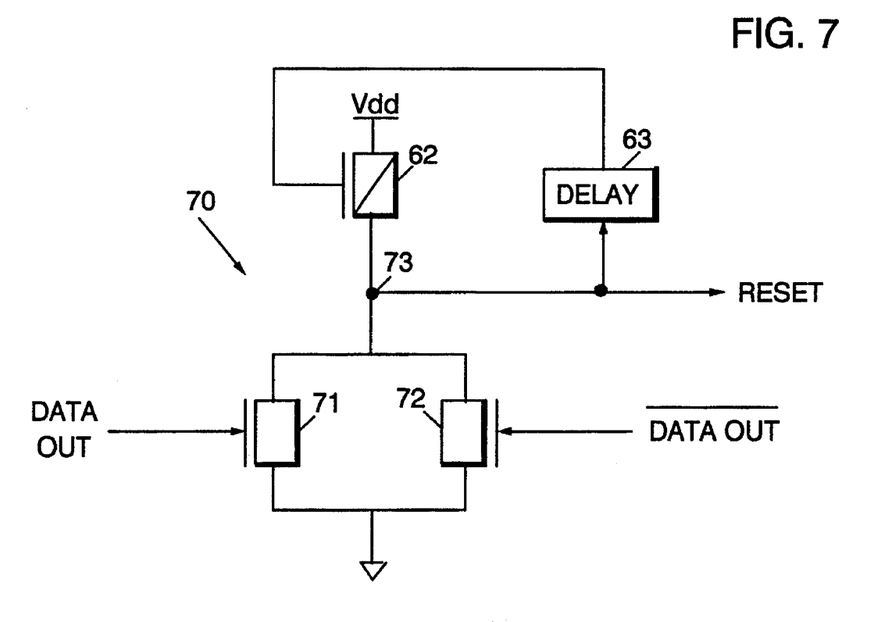
FIG. 7 illustrates a reset circuit for a dual-rail implementation of a logic circuit.

Referring to FIG. 7, there is shown an implementation of reset circuit 70 whereby Data Out and the complement of Data Out are received by N-FET devices 71 and 72, respectively, arranged in parallel between node 73 and the ground potential. With this arrangement, regardless of the level of Data Out, a proper reset signal will be applied to the logic circuit, i.e., a low level signal will be applied to the gate electrode of P-FET device 44 for circuit 40. Note, reset circuit 70 also utilizes its own precharging circuitry through the use of delay circuit 63 and P-FET device 62 in a similar manner as described above with respect to FIG. 6 in order to reset a high voltage level at node 73 for subsequent reset operations.

Figure 9:
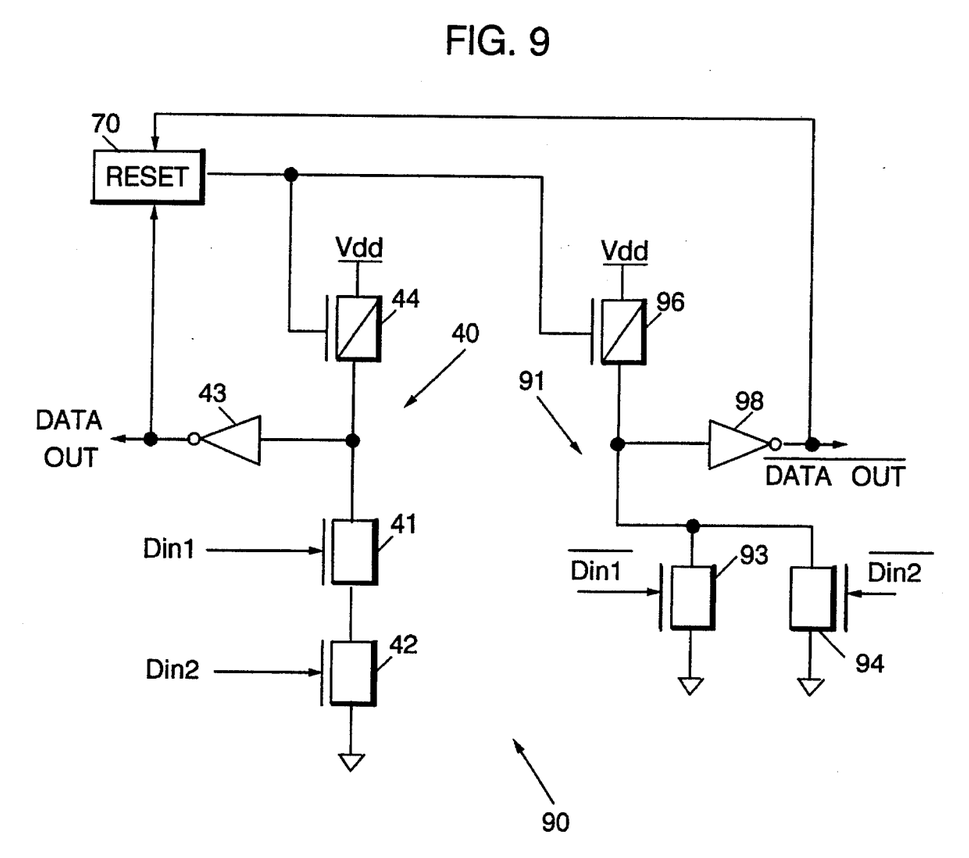
FIG. 9 illustrates a detailed diagram of a dual-rail self-resetting logic circuit.

In order to implement logic circuitry having both Data Out and the complement of Data Out, additional circuitry must be implemented within each logic circuit, such as illustrated in FIG. 9. FIG. 9 illustrates logic circuit 90, which comprises logic circuit 40 and its complement, logic circuit 91. Logic circuit 91 is similar to logic circuit 40 except that it receives the complements of Din1 and Din2 into N-FET devices 93 and 94, respectively, resulting in the output of a complement to Data Out. Both the output Data Out and the complement of Data Out are inputted into reset circuit 70, which sends a reset signal to P-FET devices 44 and 96 in order to precharge logic circuits 40 and 91, respectively. Since reset circuit 70 is tied to both the output and the complement of the output of circuit 90, reset circuit 70 will be able to send a low level reset signal to devices 44 and 96 in order to precharge both of logic circuits 40 and 91, respectively.

The disadvantage of circuit 90 is that it requires essentially double the circuitry for each logic circuit 90 in order to appropriately implement the reset functionality. Within VLSI circuitry, doubling the area requirement for each logic circuit will basically result in double the area required for the VLSI circuitry, which may not be desirous.

Thus, there is a need in the art for an implementation of reset functionality within logic circuitry that does not require dual-rail inputs and outputs for each logic circuit.

SUMMARY OF THE INVENTION

The foregoing need is satisfied by the present invention, which implements self-resetting CMOS logic circuitry, wherein the reset functionality is performed in a "forward" manner. Instead of monitoring the dual-rail outputs of the logic circuit and then using this monitored output to send a reset signal to the P-FET of the logic circuit in order to precharge the logic circuit, a complement input signal of one of the inputted data signals is sent to the reset circuit along with the true version of the input signal. The reset signal is then forwarded to each logic circuit within a series of multistaged logic circuits through the use of timing circuits (such as buffers) so that the reset function for each logic circuit is performed at the appropriate time (the reset function is performed after the logic operation of a particular logic circuit has been performed with respect to the originally inputted data).

An advantage of the present invention is that it does not require dual-rail inputs and outputs to the logic circuitry in order to correctly perform the reset function for a logic circuit. Instead, each logic circuit merely requires single-rail inputs and outputs, which saves VLSI area and power consumption with the CMOS circuitry. The logic circuit also retains the fast conditional discharge when the select or evaluation device is turned on.

Another advantage of the present invention is that the reset circuit is now activated by the incoming data versus the output of the logic circuit. This is beneficial in complex multistage circuits where the reset must wait a long time to be triggered by the output. The reset stage activates the timing circuitry (delay elements) that provide the discretely timed precharged pulses to the logic circuit. These pulses can now arrive sooner than in the dual-rail implementation, thus conditioning the logic circuit to accept new input variables. The result is that a minimum achievable cycle time may be reduced.

Yet another advantage of the present invention is that VLSI circuitry may be implemented with greater density, and performance.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

In the following description, numerous specific details are set forth to provide a thorough understanding of the present invention. However, it will be obvious to those skilled in the an that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 10:
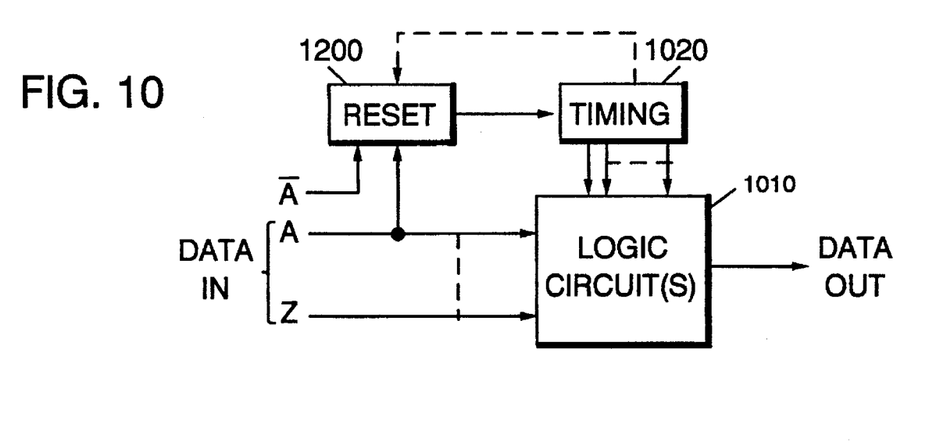
FIG. 10 illustrates a forward reset logic circuit.

Referring to FIG. 10, there is illustrated a block diagram of forward self-resetting logic circuitry using single-rail inputs and outputs. Logic circuit(s) 1010 may have a plurality of Data In inputs A—Z and at least one data output Data Out. As will be further described in more detail below, one of the Data In inputs, input A, is supplied to reset circuit 1200 along with its complement, i.e., the inverse of A. In response, reset circuit 1200 produces a reset signal, which is supplied to logic circuit(s) 1010 through timing circuitry 1020. Timing circuitry 1020 may be comprised of one or more buffer circuits. The dashed line illustrates that a return of the reset signal may be provided to reset circuit 1200 in order to precharge reset circuit 1200, as will be further described below.

Figure 11:
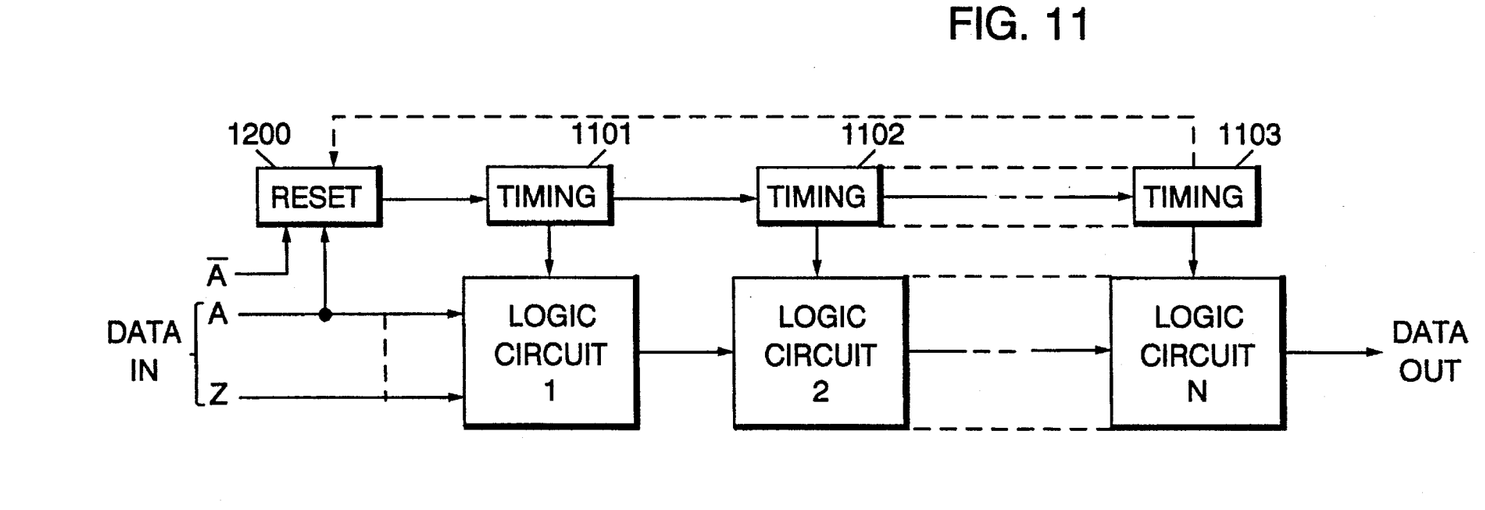
FIG. 11 illustrates a multistage forward reset logic circuit.

Referring next to FIG. 11, there is illustrated a more detailed diagram of a forward reset implemented CMOS logic circuitry cascaded into a multitude of stages comprising logic circuits 1-N. Such multistage logic circuitry is quite typical in VLSI circuitry. FIG. 11 is used to illustrate that the reset signal from reset circuit 1200 is supplied to each of logic circuits 1-N through timing circuits 1101–1103, respectively. For example, timing circuit 1101 may be configured with one or more buffer circuits (or some other typically used circuitry for delay functions) so that the reset signal from reset circuit 1200 is supplied to logic circuit 1 subsequent to the performance of the logical operation within logic circuit 1. As with dual-rail inputs and output configured logic circuits utilizing a reset function, the reset signal operates to precharge logic circuit 1 to a specified state.

Figure 12:
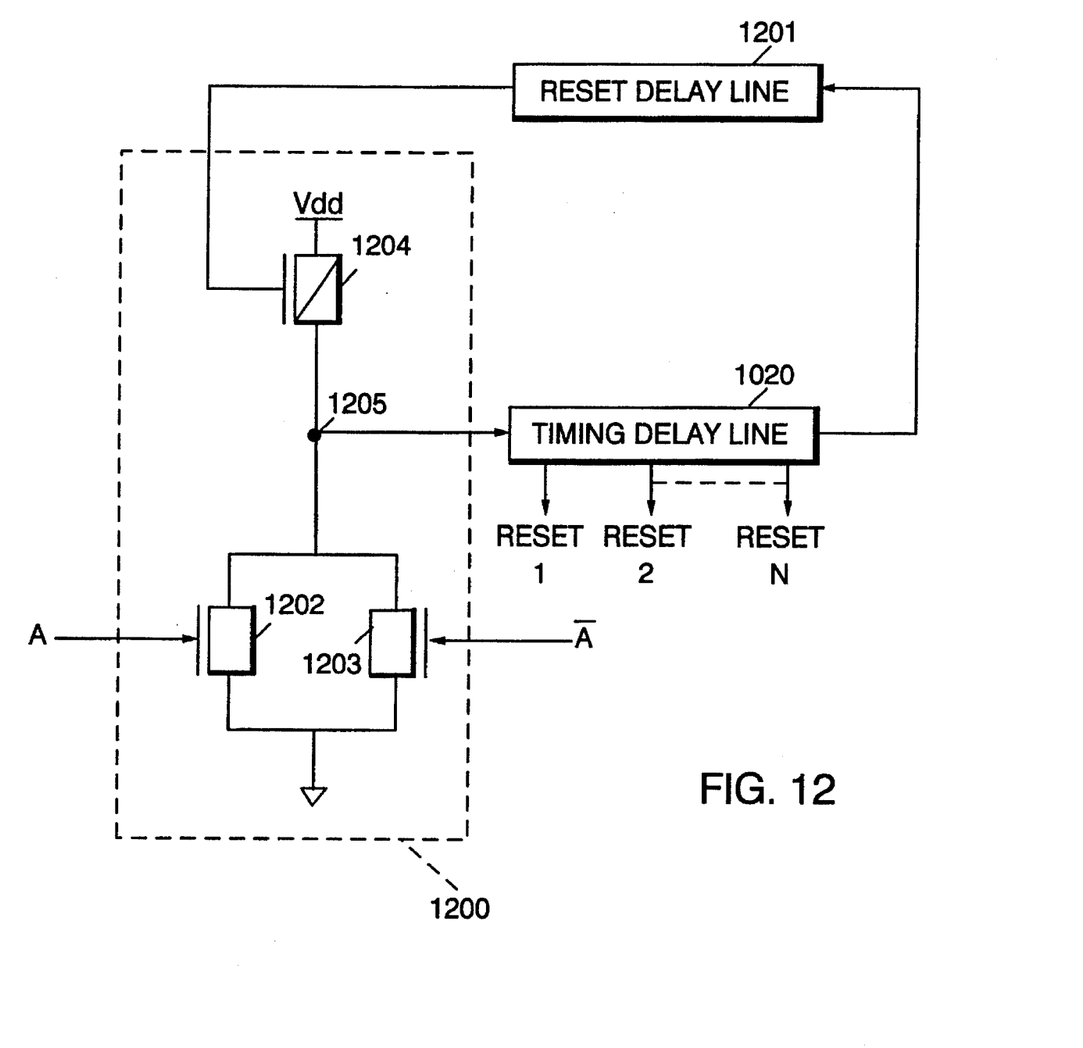
FIG. 12 illustrates a detailed diagram of the reset circuit illustrated in FIG. 11.

Referring next to FIG. 12, there is illustrated reset circuit 1200 supplying a reset signal to timing delay line 1020, which transfers the reset signals to logic circuits (not shown) such as those illustrated in FIG. 11. Essentially, timing delay line 1020 provides the same functionality as timing circuits 1101–1103.

Note that the reset signal is also outputted from timing delay line 1020 and provided to reset delay line 1201. Reset delay line 1201 may also comprise one or more buffer circuits configured so that the reset signal is supplied at the appropriate time to the gate electrode of P-FET 1204 in order to reset or precharge node 1205 of reset circuit 1200 so that it is ready for the next set of Data In input signals. Note that this portion of the circuitry illustrated in FIG. 12 corresponds to the dashed lines illustrated in FIGS. 10 and 11.

Figure 13:
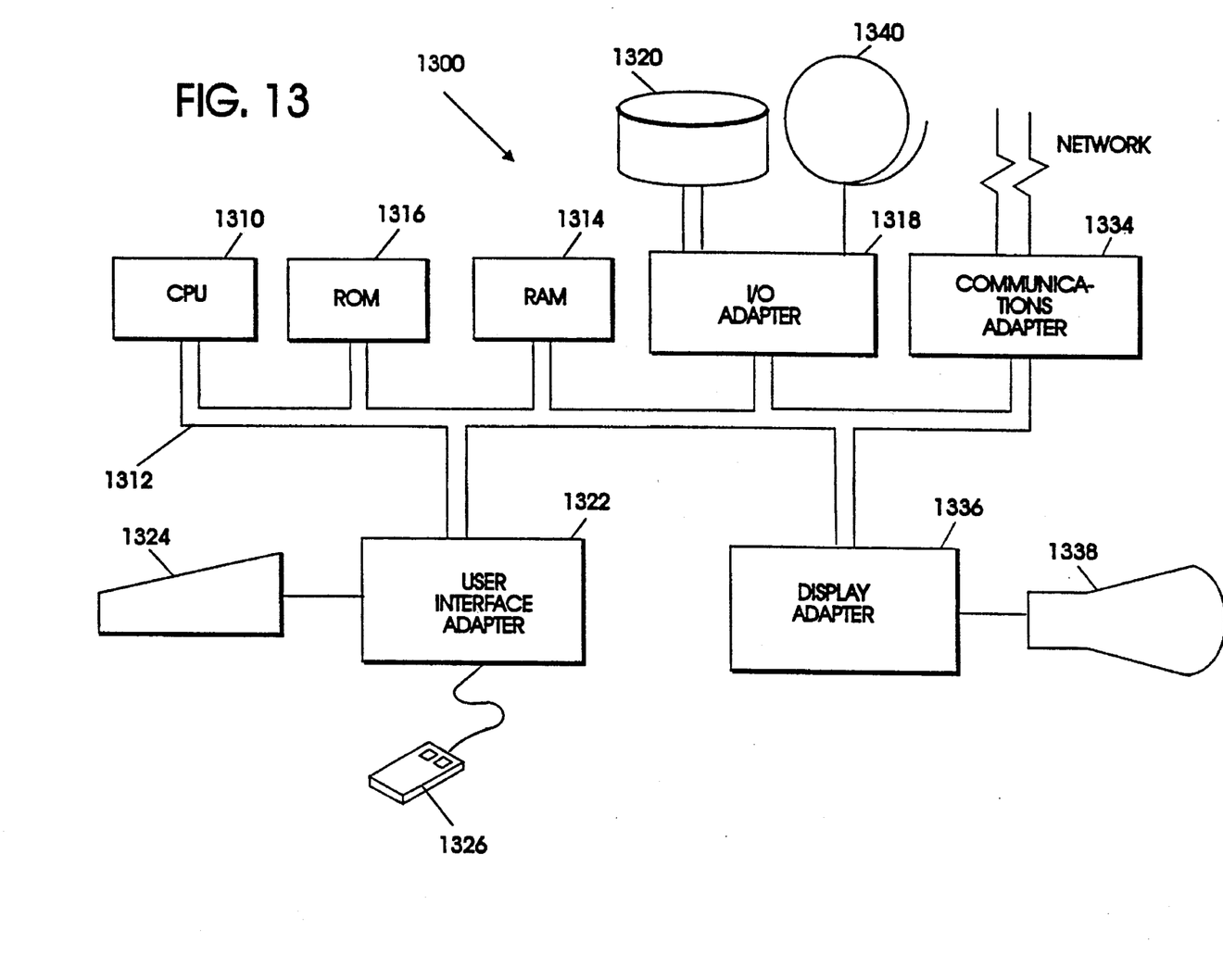
FIG. 13 illustrates a data processing system configurable in accordance with the present invention.

A representative hardware environment for practicing the present invention is depicted in FIG. 13, which illustrates a typical hardware configuration of data processing system 1300 in accordance with the subject invention having central processing unit 1310, such as a conventional microprocessor, and a number of other units interconnected via system bus 1312. System 1300 includes random access memory (RAM) 1314, read only memory (ROM) 1316, and input/output (I/O) adapter 1318 for connecting peripheral devices such as disk units 1320 and tape drives 1340 to bus 1312, user interface adapter 1322 for connecting keyboard 1324, mouse 1326, and/or other user interface devices such as a touch screen device (not shown) to bus 1312, communication adapter 1334 for connecting system 1300 to a data processing network, and display adapter 1336 for connecting bus 1312 to display device 1338.

Since any one of the devices in system 1300 may be comprised of CMOS circuitry, the forward self-resetting CMOS circuitry as described within the present invention and as illustrated in FIGS. 10–12 may be utilized within any one of the devices in system 1300.

Although the present invention and its advantages have been described in detail, it should be understood that various changes, substitutions and alterations can be made herein without departing from the spirit and scope of the invention as defined by the appended claims.

What is claimed is:

1. A logic circuit, comprising:

one or more data inputs to said logic circuit;

one or more data outputs from said logic circuit; and a reset circuit coupled to said logic circuit, said reset circuit coupled to said one or more data inputs, said reset circuit coupled to a complement of said one or more data inputs.

2. The logic circuit as recited in claim 1, wherein said reset circuit sends a reset signal to said logic circuit to precharge said logic circuit to a selected state.

3. The logic circuit as recited in claim 2, wherein said selected state is a selected signal level at a selected node within said logic circuit.

4. The logic circuit as recited in claim 3, wherein said reset signal is delivered to a gate electrode of a FET device coupled between a voltage supply and said selected node within said logic circuit.

5. The logic circuit as recited in claim 1, wherein said logic circuit and said reset circuit are comprised of CMOS devices.

6. The logic circuit as recited in claim 2, wherein said reset circuit comprises a pair of N-FET devices arranged in parallel between an output node and a voltage potential, wherein a gate electrode of a first one of said pair of N-FET devices is coupled to said one or more data inputs, and wherein a gate electrode of a second one of said pair of N-FET devices is coupled to said complement of said one or more data inputs.

7. The logic circuit as recited in claim 2, further comprising a delay circuit coupled between said reset circuit and said logic circuit for delaying said reset signal from being sent to said logic circuit until after said logic circuit has performed a logical operation on said one or more data inputs.

8. The logic circuit as recited in claim 1, wherein there is only one of said one or more data outputs.

9. The logic circuit as recited in claim 1, wherein said reset circuit is operable to reset a node in said logic circuit to a particular predetermined state.

10. The logic circuit as recited in claim 1, where said reset circuit is operable to convert a node in said logic circuit from a first state to a second state.

11. A method for precharging a logic circuit to a selected state, wherein said logic circuit has one or more data inputs and a data output, said method comprising the steps of:

receiving one of said one or more data inputs;

receiving a complement of said one of said one or more data inputs;

producing a precharge signal in response to receipt of said one of said one or more data inputs and said complement of said one of said one or more data inputs;

sending said precharge signal to said logic circuit;

precharging said logic circuit to said selected state in response to receipt of said precharge signal; and delaying said precharging step until subsequent to performance of a logical operation by said logic circuit on said one or more data inputs.

12. A method for precharging a logic circuit to a selected state, wherein said logic circuit has one or more data inputs and a data output, said method comprising the steps of:

receiving one of said one or more data inputs:

receiving a complement of said one of said one or more data inputs;

producing a precharge signal in response to receipt of said one of said one or more data inputs and said complement off said one of said one or more data inputs;

sending said precharge signal to said logic circuit;

precharging said logic circuit to said selected state in response to receipt of said precharge signal; and delaying said precharging step until subsequent to performance of a logical operation by said logic circuit on said one or more data inputs, wherein said step of receiving one of said one or more data inputs further comprises the step of applying said one of said one or more data inputs to a gate electrode of a first FET device, and wherein said step of receiving a complement of said one of said one or more data inputs further comprises the step of applying said complement of said one of said one or more data inputs to a gate electrode of a second FET device, wherein said first and second FET devices are coupled in parallel between a voltage potential and a node within a reset circuit coupled to said logic circuit.

13. The method as recited in claim 12, further comprising the steps of: returning said precharge signal to said reset circuit; and resetting said reset circuit with said returned precharge signal.

14. A data processing system comprising a plurality of devices coupled together by a bus, wherein one of said plurality of devices comprises logic circuitry, wherein said plurality of devices includes a processor, a storage device, a random access memory, a display device, and an input device, said logic circuitry comprising:

a plurality of staged logic circuits;

means, coupled to a first one of said plurality of staged logic circuits, for receiving a plurality of data input signals;

a reset circuit coupled to a means for receiving one of said plurality of data input signals;

means, coupled to said reset circuit, for receiving a complement signal of said one of said plurality of data input signals;

timing circuits coupled to each of said plurality of staged logic circuits; and means for coupling an output of said reset circuit to each of said plurality of staged logic circuits through said timing circuits.

15. The system as recited in claim 14, wherein said reset circuit is operable to send a reset signal to said each of said plurality of staged logic circuits to reset said each of said plurality of staged logic circuits to a selected state subsequent to said each of said plurality of staged logic circuits performing a logical operation.

16. The system as recited in claim 15, wherein said logic circuitry further comprises a means for returning said reset signal to said reset circuit and a means for precharging said reset circuit with said reset signal.

17. The system as recited in claim 15, wherein said reset circuit comprises:

a first FET device having a gate electrode coupled to said means for receiving one of said plurality of data input signals;

a second FET device having a gate electrode coupled to said means for receiving a complement signal of said one of said plurality of data input signals, wherein said first FET device and said second FET device are coupled in parallel between a first voltage potential and a node within said reset circuit, wherein said node is coupled to said output of said reset circuit; and a third FET device coupled between said node and a second voltage potential, wherein a gate electrode of said third FET device is coupled to said output of said reset circuit though said timing circuits.

18. The system as recited in claim 17, wherein said logic circuitry further comprises delay circuitry coupled between said timing circuits and said gate electrode of said third FET device.

19. The system as recited in claim 15, wherein said first one of said plurality of staged logic circuits comprises:

a plurality of FET devices coupled to said means for receiving a plurality of data input signals, wherein said plurality of FET devices are coupled between a first voltage potential and a node within said first one of said plurality of staged logic circuits; and a FET device coupled between said node and a second voltage potential, wherein a gate electrode of said FET device is coupled to said output of said reset circuit through one of said timing circuits.

* * * * *